United States Patent
Yamada (10) Patent No.: US 7,743,305 B2
(45) Date of Patent: Jun. 22, 2010

(54) TEST APPARATUS, AND ELECTRONIC DEVICE

(75) Inventor: Tatsuya Yamada, Tokyo (JP)

(73) Assignee: Advantest Corporation, Tokyo (JP)

( * ) Notice: Subject to any disclaimer, the term of this patent is extended or adjusted under 35 U.S.C. 154(b) by 593 days.

(21) Appl. No.: 11/688,838

(22) Filed: Mar. 20, 2007

(65) Prior Publication Data

US 2008/0258749 A1    Oct. 23, 2008

(51) Int. Cl.
*G06F 11/00* (2006.01)

(52) U.S. Cl. ................................... 714/738

(58) Field of Classification Search .................. None
See application file for complete search history.

(56) References Cited

U.S. PATENT DOCUMENTS

| | | | | |
|---|---|---|---|---|
| 4,672,583 | A * | 6/1987 | Nakaizumi | 365/222 |
| 5,812,562 | A * | 9/1998 | Baeg | 714/726 |
| 6,065,143 | A * | 5/2000 | Yamasaki et al. | 714/720 |
| 6,092,225 | A * | 7/2000 | Gruodis et al. | 714/724 |
| 6,992,949 | B2 * | 1/2006 | Chae et al. | 365/230.06 |
| 2001/0038570 | A1 * | 11/2001 | Nakano et al. | 365/233 |
| 2003/0031082 | A1 * | 2/2003 | Sawada | 365/233 |
| 2005/0078545 | A1 * | 4/2005 | Chae et al. | 365/230.06 |
| 2005/0166097 | A1 * | 7/2005 | An | 714/42 |
| 2006/0294443 | A1 * | 12/2006 | Fekih-Romdhane | 714/738 |

FOREIGN PATENT DOCUMENTS

| | | |
|---|---|---|
| DE | 19781563 T0 | 12/1998 |
| EP | 1640735 A1 | 3/2006 |
| EP | 1662265 A1 | 5/2006 |
| JP | 08-094724 | 4/1996 |
| JP | 10-078476 | 3/1998 |
| WO | WO98/23968 | 6/1998 |
| WO | WO2004/109307 | 12/2004 |

OTHER PUBLICATIONS

Office Action issued in German Application No. 10 2008 016 117.9-35 mailed on Nov. 9, 2009 and English translation thereof, 15 pages.

* cited by examiner

*Primary Examiner*—Kevin L Ellis
*Assistant Examiner*—Guerrier Merant
(74) *Attorney, Agent, or Firm*—Osha • Liang LLP (57) ABSTRACT

A test apparatus that tests a device under test is provided. The test apparatus includes: a main memory that stores a test data row for testing the device under test; a cache memory that caches the test data row read from the main memory; a pattern generation control section that reads each test data which is not aligned in units of word being a data transfer unit of the main memory and writes the same to cache entries different from each other in the cache memory for each test data; and a pattern generating section that sequentially reads the test data stored of each cache entry in the cache memory and generates a test pattern for testing the device under test.

9 Claims, 10 Drawing Sheets

MAIN MEMORY 40

| | TEST DATA 0 1 2 3 4 ··· 126 127 |
|---|---|
| WORD 1 | DATA A \| DATA B |
| WORD 2 | DATA B \| DATA C |
| WORD 3 | DATA D \| DATA E |
| ⋮ | ⋮ |

*FIG. 4A*

CACHE MEMORY

| ENTRY | TEST DATA 0 1 2 3 4 ··· 126 127 |
|---|---|
| 1 | DATA A |
| 2 | DATA B |
| 3 | DATA C |
| ⋮ | ⋮ |

FIG. 10

TEST APPARATUS, AND ELECTRONIC DEVICE

BACKGROUND

1. Technical Field

The present invention relates to a test apparatus and an electronic device. Particularly, the present invention relates to a test apparatus that tests a device under test and an electronic device including a test circuit.

2. Related Art

Generally, there may be a case that a test pattern having a predetermined logic pattern is generated and inputted to a device under test in order to test the device under test such as a semiconductor circuit. For example, a test to determine whether the device under test normally operates can be performed by writing a predetermined logic value to a memory region in the device under test and reading the written logic pattern.

A pattern generating section that generates a test pattern based on pattern data and sequence data has been known. The pattern generating section sequentially reads the pattern data and the sequence data stored in the main memory and stores the same in the cache memory.

Here, the following documents have been known as the related art documents of the pattern generating section:

1. International Publication (WO) 2004/109307 brochure
2. International Publication (WO) 1998/23968 brochure
3. Japanese Patent Application Publication No. 8-94724
4. Japanese Patent Application Publication No. 10-78476

The main memory previously stores therein the pattern data and the sequence data set by such as a user before testing a device under test. Data is written to the main memory in units of word having a predetermined bit length. In addition, the data is read from the main memory in units of word. One word includes one instruction data of the sequence data or one pattern of the pattern data. However, it is not necessarily the case that the bit length of the instruction data or the pattern is corresponding to the bit length of a word.

Therefore, there may be an unused bit in each word. Since the main memory stores therein data in units of word, the availability ratio of the main memory could be reduced if there is any unused portion in the storage area thereof. In addition, since the main memory transfers the data in units of word thereby the unused bit included in each word is also transferred, so that the efficiency of transferring data could be reduced.

SUMMARY

Accordingly, it is an advantage of the invention to provide a test apparatus and an electronic device which are capable of solving the above-mentioned problem. This advantage may be achieved through the combination of features described in independent claims of the invention. Dependent claims thereof specify preferable embodiments of the invention.

Thus, a first aspect of the present invention provides a test apparatus that tests a device under test. The test apparatus includes: a main memory that stores a test data row for testing the device under test; a cache memory that caches the test data row read from the main memory; a pattern generation control section that reads each test data which is not aligned in units of word being a data transfer unit of the main memory and writes the same to cache entries different from each other in the cache memory for each test data; and a pattern generating section that sequentially reads the test data stored of each cache entry in the cache memory and generates a test pattern for testing the device under test.

A second aspect of the present invention provides an electronic device. The electronic device includes a circuit under test that operates in accordance with a signal inputted to the device at the time at which the device is actually operated and a test circuit that tests the circuit under test. The test apparatus includes: a main memory that stores a test data row for testing the circuit under test; a cache memory that caches the test data row read from the main memory; a pattern generation control section that reads each test data which is not aligned in units of word being a data transfer unit of the main memory and writes the same to cache entries different from each other in the cache memory for each test data; and a pattern generating section that sequentially reads the test data stored of each cache entry in the cache memory and generates a test pattern for testing the circuit under test.

It is noted that the summary of the invention described above does not necessarily describe all necessary features of the invention. The invention may also be a sub-combination of the features described above.

DESCRIPTION OF EXEMPLARY EMBODIMENTS

The invention will now be described based on preferred embodiments, which do not intend to limit the scope of the invention, but exemplify the invention. All of the features and the combinations thereof described in the embodiments are not necessarily essential to the invention.

Figure 1:
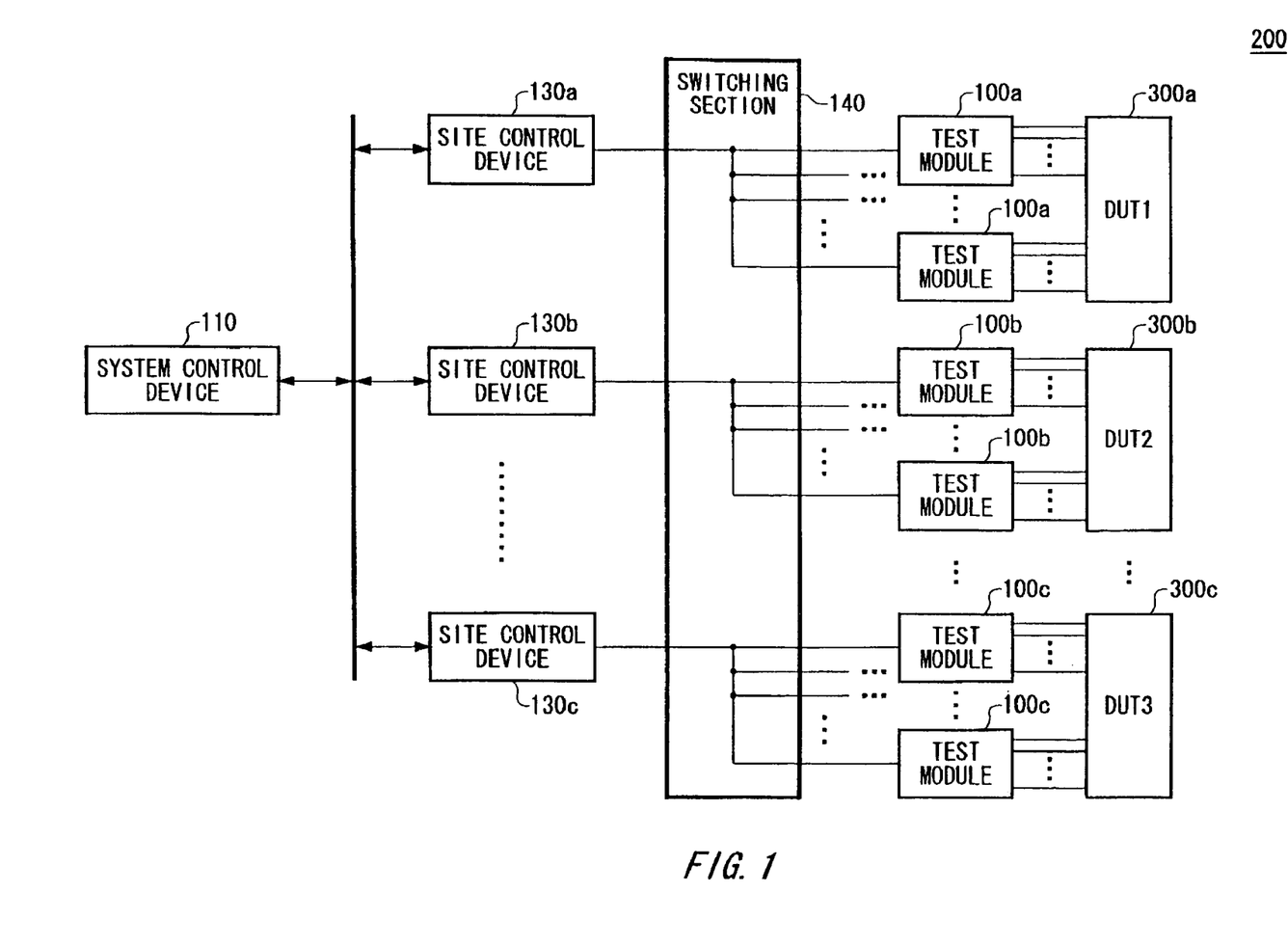
FIG. 1 shows an example of the configuration of a test apparatus 200 according to an embodiment of the present invention.

FIG. 1 shows an example of configuration of a test apparatus 200 according to an embodiment of the present invention. The test apparatus 200 tests device under tests 300 such as semiconductor circuits and includes a system control device 110, a plurality of site control devices 130, a switching section 140 and a plurality of test modules 100.

The system control device 110 receives a test control program, test program data and test pattern data to test the device under tests 300 through an external network and stores therein the same. The plurality of site control devices 130 are connected to the system control device 110 through a communication network.

The site control devices 130a-c controls to test any of the device under tests 300. For example, each of the plurality of site control devices 130 is aligned corresponding to each of the device under tests 30 one on one. Each of the site control devices 130 controls the corresponding device under test 300.

The site control device 130a controls to test the device under test 300a, and the site control device 130b controls to test the device under test 300b in FIG. 1. Alternatively, the plurality of site control devices 130 may control to each of the plurality of device under tests 300, respectively.

Specifically, the site control device 130 acquires the test control program from the system control device 110 and executes the same. Next, the site control device 130 acquires from the system control device 110 the test program data such as sequence data described later and the test pattern data such as pattern data described later used to test the corresponding device under test 300 based on the test control program. Hereinafter, the test program data and the test pattern data are generically referred to as test pattern rows. The data row may be data including at least one of the test program data and the test pattern data.

In addition, the site control device 130 stores in one or more test modules 100 used to test the device under tests 300 through the switching section 140. Next, the site control device 130 instructs the test modules 100 to start to test in accordance with the test program data and the test pattern data through the switching section 140. Then, the site control device 130 receives such as an interrupt indicating that the test is terminated from the test modules 100 and causes the test modules 100 to perform the next test based on the test result.

The switching section 140 connects each of the plurality of site control devices 130 to the plurality of test modules 100 controlled by the each of the plurality of site control devices 130 and relays the communication therebetween. Here, a predetermined site control device 130 may set the switching section 140 in order to connect each of the site control devices 130 to one or more test modules used to test the device under test 300 by the site control device 130 based on the instruction by such as the user of the test apparatus 200 and the test control program.

For example, the site control device 130a is set to be connected to the plurality of test modules 100a and tests the device under test 300a by using the plurality of test modules 100 in FIG. 1. Here, the configuration and the operation of the other site control devices 130 to test the device under tests 300 by using the test modules 100 may be the same as those of the site control device 130a to test the device under test 300a. Hereinafter, it will be mainly described that the configuration and the operation of the site control device 130a to test the device under test 300a.

The test module 100a generates a timing signal appropriate for generating a test signal used to test the device under test 300a based on the instruction by the site control device 130a. In addition, any of the test modules 100a may receive the test result of the other test module 100a and cause the plurality of test modules 100a to execute the sequence corresponding to pass/fail of the test result.

Each of the plurality of test modules 100a is connected to each of a plurality of terminals included in the device under test 300a and tests the device under test 300a based on the sequence data and the pattern data stored in the site control device 130a. Testing the device under test 300a, the test modules 100a generate test signals from the pattern data based on the sequence data and the pattern data designated by a pattern list described later and provides the test signal to the terminal of the device under test 300a connected to the test module 100a.

Next, each of the test modules 100a acquires an output signal as the result that the device under test 300a operates based on the test signal and compares the same with an expected value. Here, each of the plurality of test modules 100a may generate a test signal based on cycle periods different from each other in order to dynamically change the cycle period of the test signal based on the sequence data and the pattern data.

In addition, completing the processing of the test program data, the test module 100a generates an interrupt on the site control device 130a when any failure occurs during executing the test program data. The interrupt is notified to the site control device 130a corresponding to the test module 100a through the switching section 140, so that a processor included in the site control device 130a performs an interrupt processing.

Here, the test apparatus 200 is provided by an open architecture, and can use various modules which meet the open architecture standard. Then, the test apparatus 200 can insert the module such as the test module 100 into any connecting slot included in the switching section 140.

In this case, the user of the test apparatus 200 can change the connection configuration through such as the site control device 130a and connect a plurality of modules used to test the device under tests 300 to the site control devices 130 to control to test the device under tests 300. Thereby the user of the test apparatus 200 can select the appropriate module dependent on the number of terminals, the placement of terminals, the kind of terminals or the kind of test for each of the plurality of device under tests 300 and implement the same in the test apparatus 200.

In addition, the test apparatus 200 or the test module 100 may be a test circuit provided in the same electronic device in which the targeted circuit under test is provided. The test circuit is provided as such as a BIST circuit of the electronic device and diagnoses the electronic device by testing the circuit under test. Thereby the test circuit can check whether a circuit to be a circuit under test can normally perform the original operation as a circuit under test.

In addition, the test apparatus 200 or the test module 100 may be a test circuit provided on the same board or in the same apparatus on/in which a circuit under test is provided. Such test circuit also can check whether the circuit under test can normally perform the original operation as an electronic device.

Figure 2:
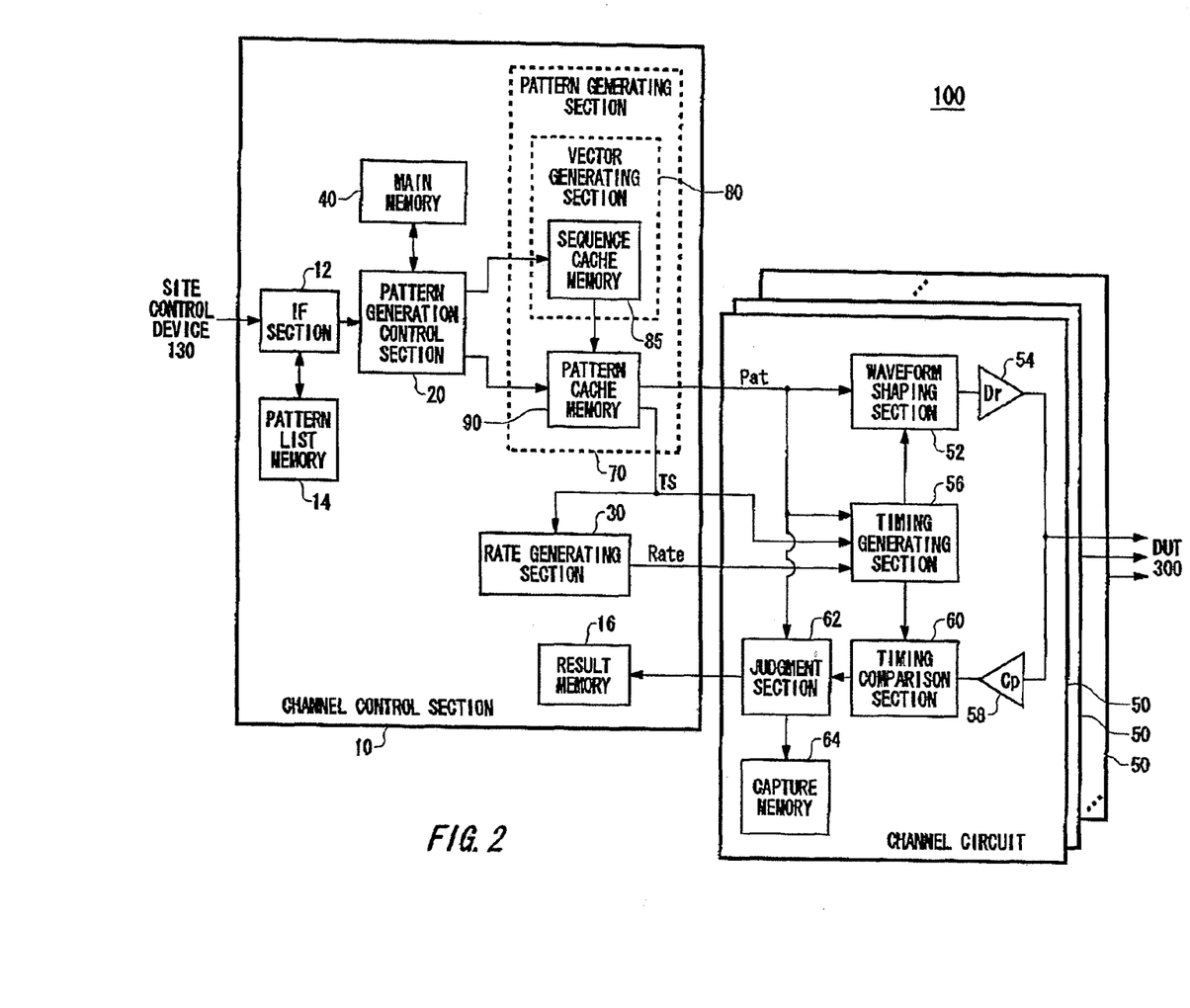
FIG. 2 shows an example of the configuration of a test module 100.

FIG. 2 shows an example of configuration of the test module 100. The test module 100 includes a channel control section 10 and a plurality of channel circuits 50. The function and the configuration of one channel circuit 50 will be described in the present embodiment. However, the other channel circuits may be the same function and configuration.

Each of the channel circuits 50 may be connected to input and output pin corresponding to the device under test 300 and provide a test signal to the input and output pins. In addition, each of the channel circuits 50 may measure an output signal from the input/output pins. Here, the input and output pins of the device under test 300 may be either the input pin or the output pin.

The channel control section 10 controls each of the channel circuits 50. For example, the channel control section 10 controls each of the channel circuits 50 to generate a test signal. In addition, the channel control section 10 controls each of the channel circuits 50 to measure an output signal from the device under test 300.

In addition, the channel control section 10 may control the other channel circuit 50 based on the measurement result of any channel circuit 50. For example, the channel control section 10 may cause at least one of the other channel circuits 50 to repeatedly perform a predetermined operation until the measurement result of any of the channel circuits 50 satisfies a predetermined condition and causes the other channel circuit 50 to perform the next appropriate operation provided that the measurement result satisfies the predetermined condition.

The channel control section 10 includes an interface section 12, a pattern list memory 14, a result memory 16, a pattern generation controlling section 20, a main memory 40, a rate generating section 30 and a pattern generating section 70. The interface section 12 passes the data between the site control devices 130 and the test modules 100.

The main memory 40 stores therein the plural kinds of sequence data and pattern data corresponding to the sequence data. The main memory 40 may previously store the sequence data and the pattern data provided from the site control devices 130 before testing the device under test 300. In addition, the main memory 40 may compress and stores the sequence data and the pattern data.

For example, the site control section 130 may input to the interface section 12 the sequence data, the pattern data and an instruction to store those data on the designated addresses of the main memory 40. The pattern generation control section 20 stores those data in the main memory 40 in accordance with the instruction received by the interface section 12.

The sequence data may be data indicative of an instruction group to be sequentially executed, for example. Here, one instruction in sequence data may be corresponding to the test data, and a plurality of instruction may be corresponding to the test data.

The pattern data is data indicative of such as a logical value pattern, and may be stored in association with a plurality of instructions one-on-one. For example, the sequence data may be an instruction group cause to generate a test pattern by outputting each of the pattern data in a predetermined order. Here, the data for one instruction among the pattern data may be corresponding to the test data, and data for a plurality of instructions among the pattern data may be corresponding to the test data.

At this time, the sequence data may generate the test pattern by using each of the pattern data several times. For example, the sequence data may include such as a loop instruction and a jump instruction. When the channel control section 10 executes such sequence data, the corresponding pattern data is expanded to generate a test signal corresponding to the sequence data and the pattern data. An example of the sequence data and pattern data stored in the main memory 40 will be described later with reference to FIG. 3.

The pattern list memory 14 stores therein a pattern list indicative of an appropriate order of executing the sequence data stored in the main memory 40. For example, the pattern list memory 14 may store the pattern list that sequentially designates addresses of the sequence data to be executed in the main memory 40. The pattern list memory 14 may previously store the pattern list provided from the site control devices 130 before testing the device under test 300 as well as the main memory 40. The pattern list may be an example of the above described test control program and also may be a part of the test control program.

The pattern generation control section 20 reads the pattern list from the pattern list memory 14 when the test apparatus 200 starts to test the device under test 300. For example, receiving an instruction on the start of the test from the site control device 130, the pattern generation control section 20 may read the pattern list from the pattern list memory 14.

The pattern generating section 20 reads the sequence data and the corresponding pattern data stored in the main memory 40 in the order according to the pattern list. The pattern generation controlling section 20 transmits the read sequence data to a vector generating diction 80 of the pattern generating section 70. In addition, the pattern generation control section 20 transmits the read pattern data to a pattern cache memory 90 of the pattern generating section 70.

The pattern generation control section 20 may read the next sequence data and pattern data and transmit the same when there is a predetermined free area in such as a cache memory and a FIFO memory of a subsequent circuit. In this case, the pattern generation control section 20 may read the next sequence data and pattern data provided that there is the predetermined free area in all the cache memory and FIFO which should store the sequence data and the pattern data, and transmit the same to the cache memory and the FIFO.

The pattern generating section 70 sequentially generate test patterns based on the sequence data and the pattern data sequentially received from the pattern generation control section 20. The pattern generating section 70 according to the present embodiment includes the vector generating section 80 and the pattern cache memory 90.

As described above, the vector generating section 80 receives the sequence data from the pattern generation control section 20. The vector generating section 80 may include a sequence cache memory 85 that stores the received sequence data in a predetermined cache entry (hereinafter referred to as an entry). (see FIG.2). The pattern cache memory 90 receives the pattern data from the pattern generation control section 20 and stores the same in the predetermined entry. The entry may be a storage area which is designated by one or more addresses.

The vector generating section 80 sequentially executes the sequence data stored in the sequence cache memory and sequentially designates the addresses in the pattern cache memory 90. For example, the address of the pattern data to be designated according to instructions may be associated with each of the instructions of the sequence data. Then, the vector generating section 80 sequentially designates the addresses in the pattern cache memory 90 according to such as a loop instruction and a jump instruction included in the sequence data.

The pattern cache memory 90 outputs the pattern data of the addresses sequentially designated. Thereby a test pattern having a logic pattern in accordance with the sequence data and the pattern data can be generated. In addition, the sequence cache memory and the pattern cache memory 90 may open the storage area for the sequence data and the corresponding pattern data after the sequence data is completely executed. The sequence data may include a termination instruction indicative of the termination of the sequence data at the end of the instruction group.

Each of the channel circuits 50 shapes a test signal based on the test pattern outputted by the pattern generating section and inputs the same to the device under test 300. In addition, each of the channel circuits 50 measures an output signal from the device under test 300. Each of the channel circuit 50 includes an waveform shaping section 52, a driver 54, a timing generating section 56, a comparator 58, a timing comparison section 60, a judgment section 62 and a capture memory 64.

The waveform shaping section 52 shapes the test signal based on the test pattern generated by the pattern generating section 70. For example, the waveform shaping section 52 may generate a test signal having a logic pattern in accordance with the test pattern. In addition, the waveform shaping section 52 may generate a test signal in accordance with a given timing signal. For example, the waveform shaping section 52 may generate a test signal of which logical value is changed in accordance with the given timing signal.

The driver 54 inputs the test signal generated by the waveform shaping section 52 to the device under test 300. The driver 54 may convert the voltage level of the test signal to the signal level appropriate to be inputted to the device under test 300 by outputting the voltage at a predetermined level H when the test signal generated by the waveform shaping section 52 indicates logic H, and by outputting the voltage at a predetermined level L when the test signal indicates logic L.

The comparator 58 may receive the output signal from the device under test 300, and convert the output signal to a binary logic signal by comparing the voltage level of the output signal with a preset reference level. For example, the comparator 58 may output logic H when the voltage level of the output signal is higher than the reference level, and output logic L when the voltage level of the output signal is lower than the reference level.

The timing comparison section 60 acquires the logical value of the signal outputted by the comparator 58 in accordance with a given strobe signal. Thereby the logic pattern of the output signal can be detected.

The timing generating section 56 generates the timing signal and the strobe signal described above in accordance with a setting value of a prepared timing set. For example, the timing generating section 56 may generate a timing signal and a strobe signal obtained by delaying a rate signal provided from the rate generating section 30 at a period corresponding to the timing set by the amount of delay corresponding to the given timing set.

The timing set may be provided to the rate generating section 30 and the timing generating section 56 every time one sequence data is executed, for example. The main memory 40 may include the data of the timing set as a part of the pattern data corresponding to the sequence data, for example. The pattern generating section 70 may set the timing set corresponding to the sequence data to the rate generating section 30 and the timing generating section 56 every time each sequence data is executed.

The judgment section 62 compares the logic pattern detected by the timing comparison section 60 with an expected value pattern. Thereby pass/fail of the device under test 300 can be judged. The expected value pattern may be generated by the pattern generating section 70. For example, the expected value pattern may be equal to the logic pattern of the test signal inputted to the device under test 300, which is included in the test pattern generated by the pattern generating section 70.

The capture memory 64 stores the result by the judgment section 62. For example, the capture memory 64 may store therein e result of pass (matching) and fail (mismatching) by the judgment section 62 for each test pattern. In addition, the capture memory 64 may select the result of fail by the judgment section 62 and store therein the same.

The result memory 16 of the channel control section 10 stores the result by the judgment section 62 in each channel circuit 50. The result memory 16 may store therein the result of pass (matching) and fail (mismatching) by the each of the judgment sections 62 in association with each channel for each test pattern. The result memory 16 may select the result of fail by each of the judgment sections 62 and store therein the same.

As described above, the capture memory 64 may store therein for each channel circuit 50 the fail information for each test pattern. Meanwhile, the result memory 16 may store for each device under test 300 the fail information for each sequence data stored in the pattern list memory 14.

Figure 3:
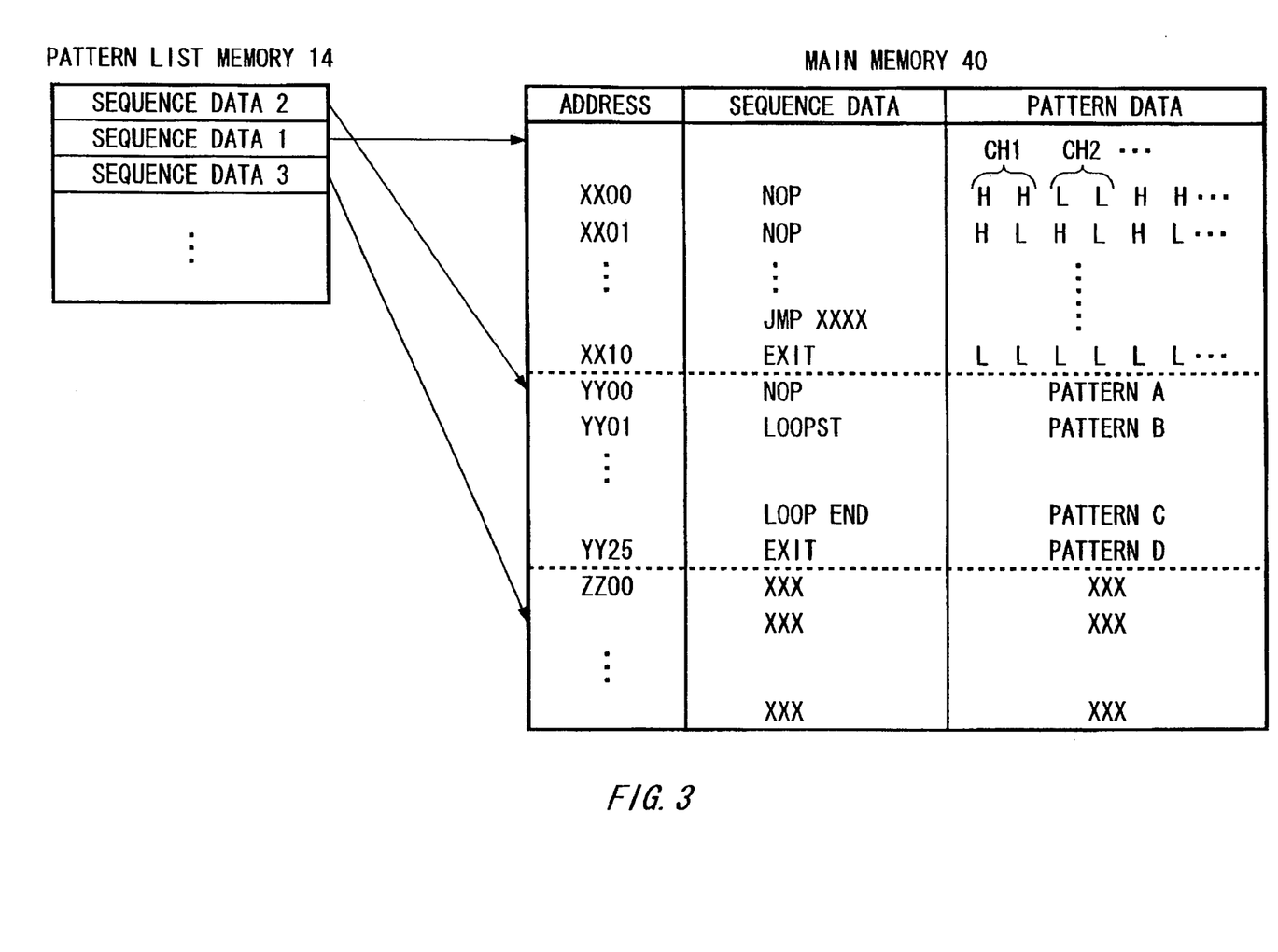
FIG. 3 is explanatory diagram showing an example of pattern lists stored in a pattern list memory 14, and sequence data and pattern data stored in a main memory 40.

FIG. 3 is explanatory diagram showing an example of pattern lists stored in the pattern list memory 14, and sequence data and pattern data stored in a main memory 40. As described above, the main memory 40 stores a plurality of sequence data (sequence data 1, sequence data 2 . . . ) and the pattern data each of which is corresponding to each sequence data.

As described above, the sequence data includes a plurality of instructions. When each of the instructions are executed, the pattern generating section 70 may output the pattern data corresponding to each of the instructions. For example, the sequence data may include NOP instruction to output the corresponding pattern data and shift the following instruction, JMP instruction to output the corresponding pattern data and further jump to the instruction at a predetermined address and LOOP instruction to output the corresponding pattern data and further repeat the instruction within the designated address range a predetermined number of times.

By executing such instruction group, each of the pattern data is outputted in order corresponding to the sequence data and a predetermined test pattern is generated. For example, when the sequence data 2 is executed, the pattern generating section 70 repeatedly outputs the pattern data B-the pattern data C the number of times designated by the LOOP instruction after outputting the pattern data A.

The main memory 40 may store therein the sequence data common to the plurality of channel circuits 50. In addition, the main memory 40 may store the pattern data for each of the channel circuits 50. For example, the main memory 40 may store the pattern data corresponding to the plurality of channel circuits for each of the instructions of the sequence data. The main memory 40 stores therein the pattern data corresponding to each of the channel circuits 50 at the bit position of which address is different from each other in FIG. 3.

The pattern memory 14 stores therein the order of the sequence data to be executed. The pattern list memory 14 stores a pattern list to sequentially designate the sequence data 2 and the sequence data 1 in FIG. 3.

The main memory 40 that stores therein the sequence data and the pattern data is provided in the channel control section 10 in the embodiment shown in FIG. 2. Meanwhile, the main memory 40 that stores therein the sequence data may be provided in the channel control section 10, and a memory that stores therein the pattern data for each of the channel circuits 50 may be provided in each of the channel circuits 50 in the other embodiment.

In this case, the pattern cache memory 90 may be provided in each of the channel circuits 50. Then, the addresses sequentially designated by the vector generating section 80 may be distributed to the pattern cache memory 90 provided in each of the channel circuits 50.

Figure 4A:
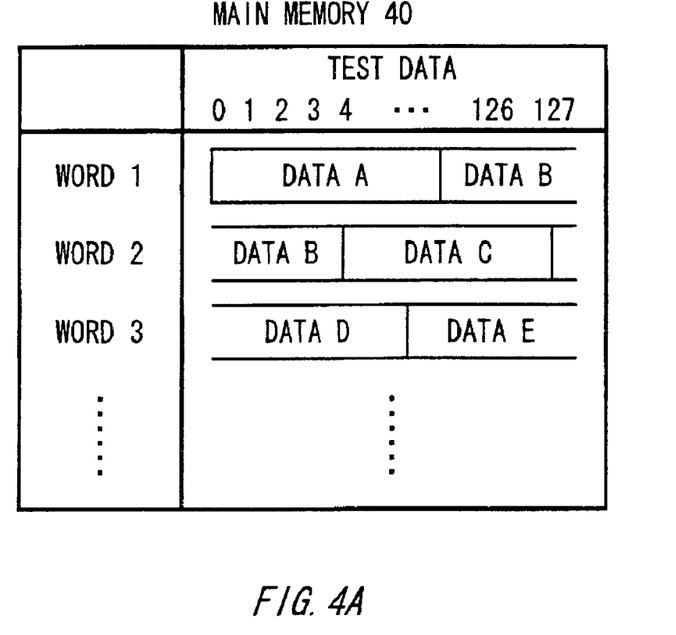
FIG. 4A is an explanatory diagram showing an example of main memory 40.

FIG. 4A is an explanatory diagram showing an example of main memory 40. As described above, the main memory 40 stores the test data rows for testing the device under tests 300. The test data rows includes a plurality of test data (A, B, C, . . . ) indicative of each instruction of the sequence data or each logic pattern of the pattern data. Each of the test data may indicate one instruction of the sequence data, or one logic pattern of the pattern data corresponding to the instruction.

The main memory 40 according to the present embodiment stores therein each test data included in the test data such that each test data is stored adjacent to each other without any free space on a storage area. For example, the main memory 40 may store therein each test data such that each test data is not aligned with the main memory 40 so as not to empty any bit being capable of storing the test data on the storage area corresponding to each word. Specifically, the main memory 40 may continuously store one test data over the storage area corresponding to a plurality of words.

Here, the word may be a unit of data transfer in the main memory 40. For example, one word may have the bit number which can be stored in the storage area designated by the predetermined number of addresses. Moreover, continuously storing over the storage area corresponding to a plurality of words means that the bit data following the bit data of the test data stored in the tail bit in the storage area corresponding to the preceding word is stored in the head bit in the storage area corresponding to the following word.

For example, the length of the word stored in the main memory 40 is 128 bits and the length of the pattern of the test data is 112 bits. Here, when the test data A is stored from the head bit corresponding to the word in the storage area, the test data A is written from the head bit corresponding to the word in the storage area up to 112 bits. Then, the following test data B is written to the remaining bits corresponding to the word in the storage area, and the remaining of the test data B is written from the head bit corresponding to the following word in the storage area.

As described above, the data transfer to the main memory 40 (data writing/reading) is performed in units of word stored in the main memory 40. When the data is read from the main memory 40, a signal indicating that the data is read from the main memory 40 is provided to the pattern generation control section 20.

The pattern generation control section 20 reads the memory data stored in the main memory 40 in units of word. At this time, the pattern generation control section 20 may sequentially read the word having the predetermined number of burst from the designated word.

For example, reading the memory data, the pattern generation control section 20 issues a reading instruction to the main memory 40. The main memory 40 outputs the memory data for each test cycle in units of word during a predetermined test cycle after receiving the instruction. Here, the data outputted by one test cycle may be corresponding to one word, the data outputted by the predetermined number of test cycles may be corresponding to one word, and the data outputted by one test cycle may be corresponding to plurality of words. In addition, the pattern generation control section 20 may sequentially issue the plurality of reading instructions to read the memory data in the main memory 40.

When the memory data is read from the main memory 40, each test data is read in the state that each test data is not aligned in units of word being the data transfer unit of the main memory as shown in FIG. 4A. The pattern generation control section 20 extracts each of the test data from the memory data read in units of word and provides the same to the pattern generating section 70.

For example, the pattern generation control section 20 may connect the memory data read from the storage area corresponding to the plurality of words and align the same. The connecting of the memory data may indicate a processing to connect two memory data such that the tail byte of the preceding memory data is connected to the head byte of the following memory data as for the memory data corresponding to the continuous two words.

In addition, the pattern generation control section 20 may extract each of the test data by sequentially cutting out the connected and aligned memory data by the pattern length of the test data. The pattern length of the test data may be previously notified to the pattern generation control section 20.

Moreover, reading the sequence data as the memory data, the pattern generation control section 20 stores the extracted test data in the sequence cache memory of the vector generating section 80. Meanwhile, reading the pattern data as the memory data, the pattern generation control section 20 stores the extracted test data in the pattern cache memory 90 as the memory data.

The site control device 130 may write the test data to the main memory 40 for each instruction included in the sequence data or for each pattern included in the pattern data. In this case, the pattern generation control section 20 may read from the main memory 40 the word to which the data should be written when each instruction or pattern is written, and store in the main memory 40 the word obtained by read/modify/write processing between the word to which the data should be written and the data to be written.

Figure 4B:
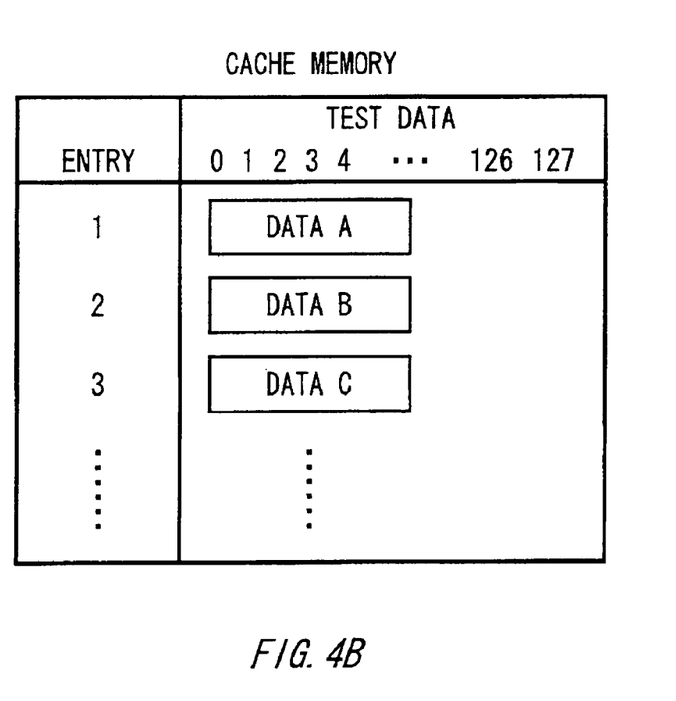
FIG. 4B is an explanatory diagram showing an example of cache memory included in a pattern generating section 70.

FIG. 4B is an explanatory diagram showing an example of cache memory included in a pattern generator 70. The sequence cache memory included in each of the pattern cache memory 90 and the vector generating section 80 may have the function and the configuration the same as those of the cache memory described with reference to FIG. 4B.

The cache memory caches each test data provided from the pattern generation control section 20 in each entry. That is, the pattern generation control section 20 writes the test data to the cache entries different from each other in the cache memory for each extracted test data. The entry may be a unit of caching by the cache memory and also may be a storage area designated by the addresses different from each other. It is preferred that each entry has the size being capable of storing therein one test data (such as one instruction of the sequence data or one logic pattern of the pattern data corresponding to the instruction).

Then, the pattern generating section 70 sequentially reads the test data stored in each cache entry of the cache memory to generate a test pattern. As described above, the pattern generating section 70 may execute the sequence data stored in the each cache entry of the sequence cache memory and expand the pattern data stored in the pattern cache memory 90 in accordance with the executed sequence to generate a test pattern.

Figure 5:
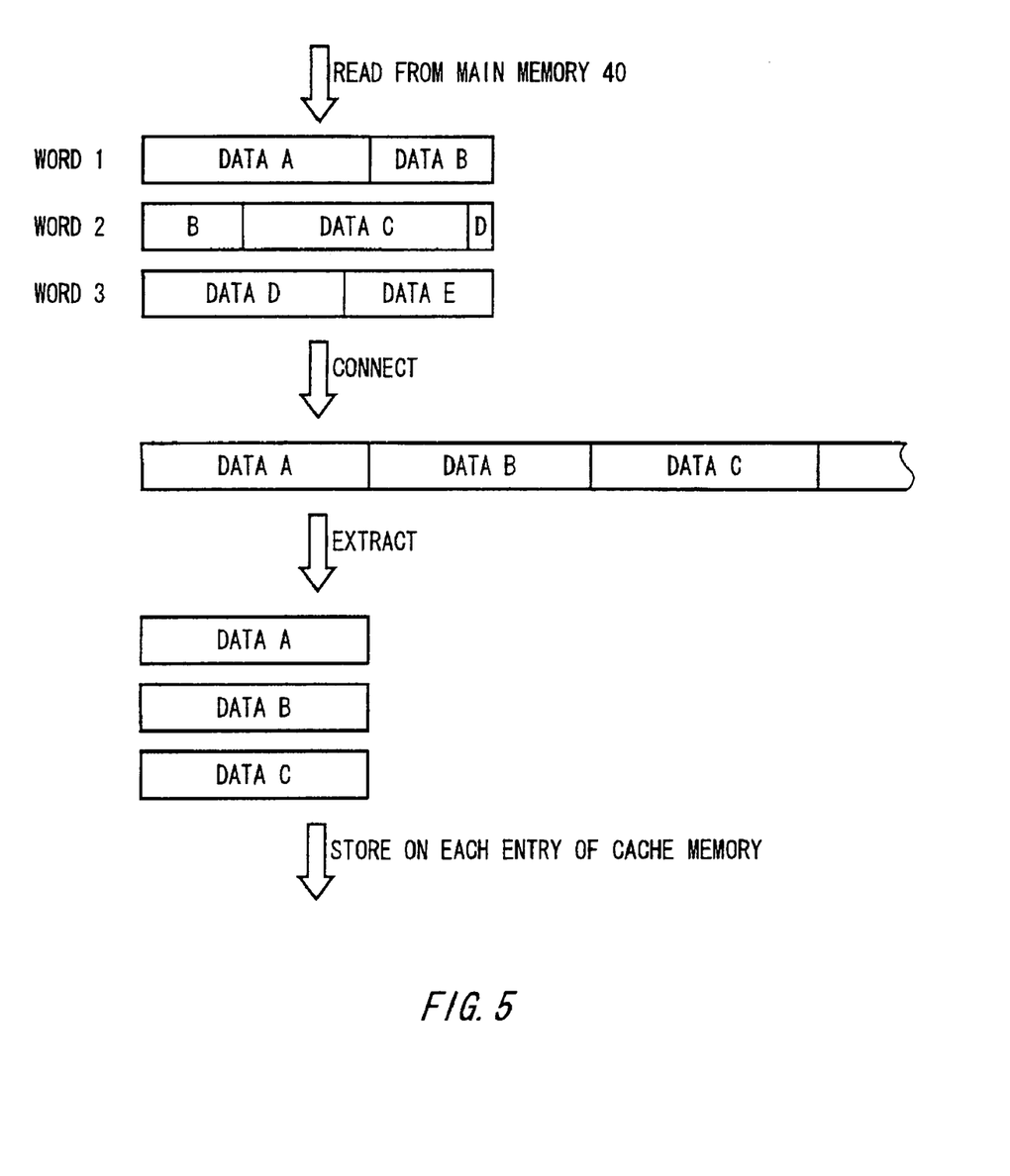
FIG. 5 shows an example of operation of a test data extraction by a pattern generation controlling section 20.

FIG. 5 shows an example of operation of a test data extraction by a pattern generation controlling section 20. As described above, the pattern generating control section 20 reads the memory data stored in the main memory 40 in units of word. Here, there may be a case that one test data is separated into a plurality of words as described above.

Therefore, the pattern generation control section 20 may sequentially connect the plurality of continuous words as shown in FIG. 5. Thereby each of the separated test data is connected. Then, the pattern generation control section 20 may extract each test data from the memory data generated by connecting each other and store the same in the cache memory. For example, the pattern generation control section 20 may extract each test data by sequentially cutting out the connected memory data by the pattern length of the test data. In addition, the pattern generation control section 20 may extract the test data after shifting the byte of the connected memory data so as to match with the head byte of a predetermined test data.

Figure 6:
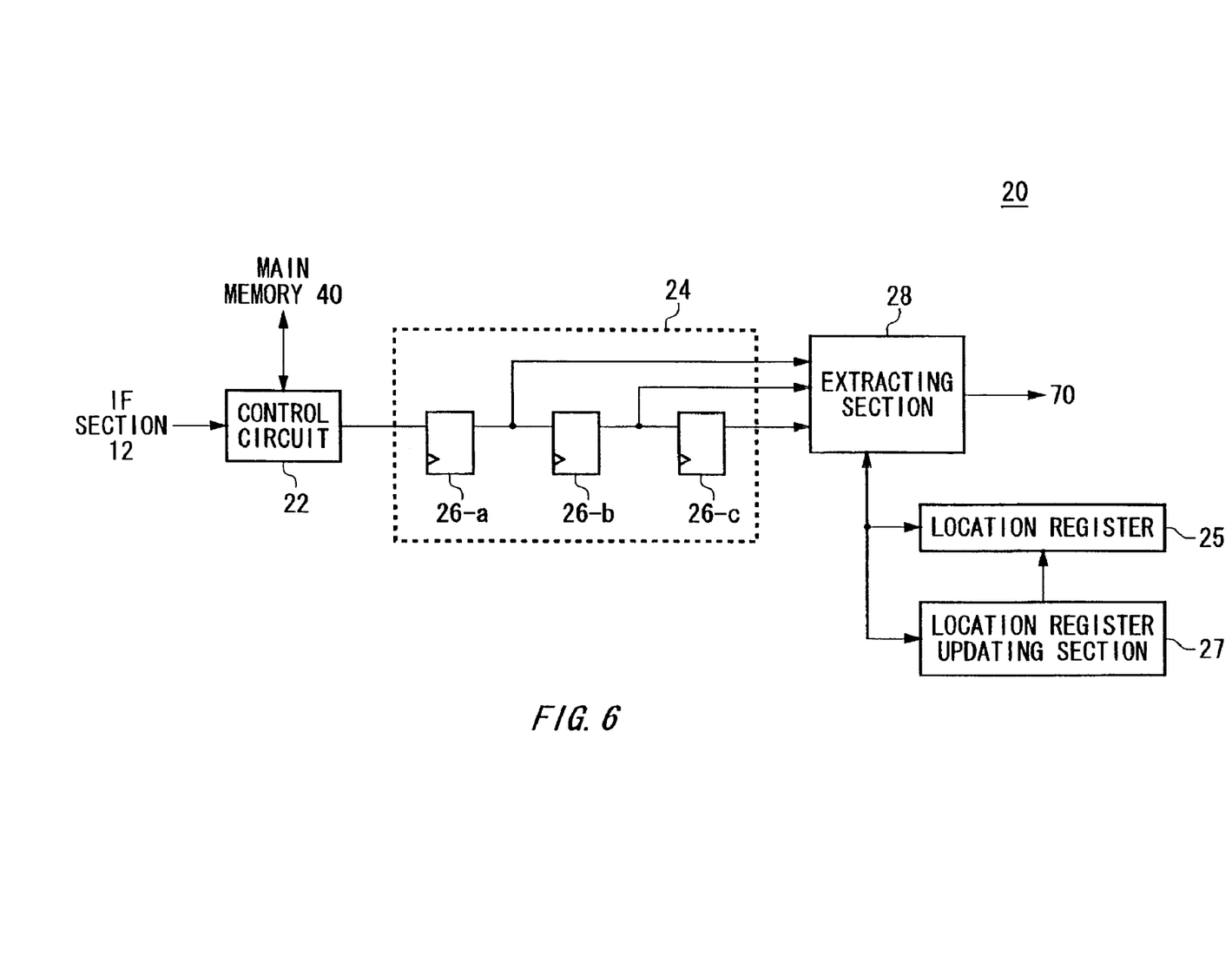
FIG. 6 shows an example of configuration of the pattern generation controlling section 20.

FIG. 6 shows an example of configuration of the pattern generation controlling section 20. The pattern generation control section 20 includes a control circuit 22, a register pipeline 24, an extracting section 28, a location register 25 and a location register updating section 27.

The control circuit 22 transfers data to/from the interface section 12 and the main memory 40. As described above, the control circuit 22 may write the test data provided from the interface section 12 to the main memory 40 and read the data from the main memory 40. In addition, the control circuit 22 inputs the data read from the main memory 40 in units of word to the register pipeline 24.

The register pipeline 24 has a plurality of registers 26 which are cascade-connected. Each of the registers 26 has a byte width being capable of storing one word. The register pipeline 24 according to the present embodiment has a triple register 26. The first stage of register 26-a sequentially stores the memory data inputted from the control section 22 in units of word for each cycle. The second and third stages of registers receive the memory data stored in the preceding register for each cycle and updates the data stored by itself. The cycle provided to each of the registers 26 may have the period the same as that of the cycle for reading one word from the main memory 40.

The extracting section 28 receives in parallel the memory data stored in the each of the registers 26. The extracting section 28 connects each of the memory data to generate the memory data for a plurality of words described with reference to FIG. 5. Then, the extracting section 28 extracts each test data from the connected memory. By such processing, the test data stored over two or more words of the main memory can be extracted.

The extracting section 28 switches between that the extracted test data is stored in the sequence cache memory and that the extracted test data is stored in the pattern cache memory 90 dependent on that the memory data read by a burst read operation is the sequence data or the pattern data.

For example, the control circuit 22 reads the memory data to be stored in the cache memory having a free area from the main memory 40 when there is the free area larger than a predetermined size in the sequence cache memory or the pattern cache memory 90. For example, when there is any free space in the pattern cache memory 90, the control circuit 22 reads the pattern data to be stored in the pattern cache memory 90 next from the main memory 40. Then, the control circuit 22 notifies the extracting section 28 of that read pattern data should be stored in the pattern cache memory 90.

The control circuit 22 may have a register that stores the addresses of the sequence data and the pattern data to be read next in the main memory 40. The control circuit 22 may update the address of the corresponding register when the sequence data or the pattern data is read from the main memory 40.

In addition, the pattern length of the sequence data and that of the pattern data may be different from each other. In this case, each pattern length may be previously set in the extracting section 28. The extracting section 28 may select any pattern length as the value for the pattern length P used for the processing described with reference to FIG. 6-FIG. 9 based on which of the sequence data or the pattern data is the memory data for the processing.

The extracting section 28 may extract the test data when the memory data stored in the last register 26-c includes at least a part of the test data to be extracted next. For example, when the memory data stored in the last register 26-c includes the head byte of the test data which has not been extracted, the extracting section 28 may extract the test data. In addition, when one test data is stored across the end portion of the memory data stored in the last register 26-c and the head portion of the memory data stored in the preceding register 26-b, the extracting section 28 may extract the test data from the memory data stored in the register 26-c and the register 26b.

Moreover, when the test data to be extracted are stored over the three registers 26 (that is, the storage area of the register 26-b is occupied by the test data), the extracting section 28 may extract the test data from the memory data stored in the three registers. In this case, since the storage area of the last register 26-c will occupied by the test data which has been extracted for the next cycle, the extraction of the test data may be skipped for the current cycle.

Whether the head byte of any test data is stored in the last register 26-c can be judged based on the location of the tail byte of the test data extracted last time, the word length for the main memory 40 and the pattern length of the test data. The location register 25 stores the location information obtained by adding 1 byte to the location of the tail byte of the test data extracted last time. That is, the location register 25 stores therein the location information indicative of the location of the head byte of the test data which has not been extracted. The location register updating section 27 updates the location information stored in the location register 25 for each cycle.

Figure 7:
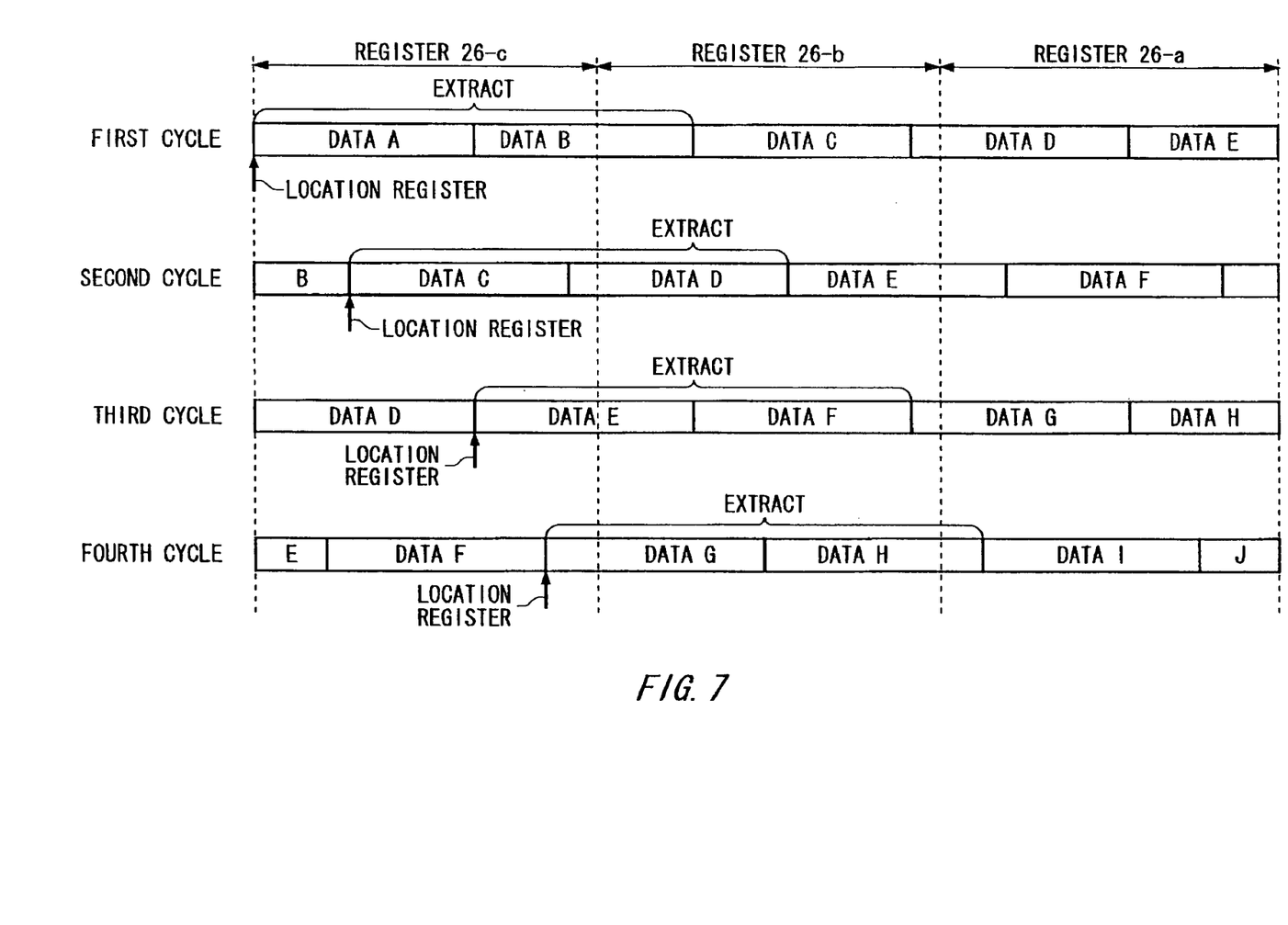
FIG. 7 shows an example of memory data stored in each register 26 in each cycle.

FIG. 7 shows an example of memory data stored in each register 26 in each cycle. The cycle as the first cycle for which the head byte of the first test data A in the connected memory data is stored on the head byte of the storage area of the last register 26-c will be described in the present embodiment.

A case will be described that the pattern length of the test data is less than the word length of the main memory 40 (i.e. the byte length of the memory data stored in one register 26) in the present embodiment. Here, the word length is not an integral multiple of the pattern length. For ease of explanation, the word length is "14" and the pattern length is "9" as operative examples. In addition, the location register 25 stores the byte location "0" as the initial value of the location information for the first cycle.

When the pattern length is longer than the word length as the present embodiment, the extracting section 28 may extract a plurality of test data in parallel such that the sum of the pattern lengths is longer than the word length. The number of test data extracted in parallel by the extracting section 28 may be the minimum integer among the numbers satisfying the condition that the sun of the pattern lengths is larger than the word length. The extracting section 28 extracts in parallel two test data for each test cycle.

All the test data A and a part of the test data B including the head byte is stored in the first cycle. In this case, the extracting section 28 extracts all the first test data A and all the second test data B from the connected memory data.

The extracting section 28 judges whether the head byte of the test data to be extracted next is stored in the last register 26-c. For example, the extracting section 28 may judge whether the head byte of the test data is stored based on the byte location and the word length stored in the location register 25. Specifically, the extracting section 28 may determine whether the byte location is less than the word length.

The extracting section 28 may cut out the data having a predetermined pattern length from the byte location stored in the location register 25 to extract the test data A. In the same way, the extracting section 28 may cut out the data having a predetermined pattern length from the byte location obtained by adding the pattern length to the former byte location to extract the test data B. Extracting two or more test data in parallel, the extracting section 28 may write the extracted test data to the cache memory in parallel.

At this time, a notification indicating that the extraction of the test data is terminated is transmitted from the extracting section 28 to the location register updating section 27. Receiving the notification, the location register updating section 27 adds the value obtained by multiplying the number of test data extracted in parallel by the pattern length and then subtracts the word length therefrom (that is, 0+2×9−14=4) in the present embodiment. The location of the head byte of the test data which has not been extracted is updated by such processing, the following test data can be extracted based on the updated byte location. It is preferred that the number of test data extracted in parallel, the word length and the pattern length may be previously notified to the extracting section 28 and the location register updating section 27.

The memory data stored in each of the registers 26 is updated by the memory data stored in the preceding register 26 for the second cycle. Also the head byte of the test data to be extracted is stored in the last register 26-c for the second cycle, so that the extracting section 28 extracts the test data C and the test data D. The byte location stored in the location register 25 is updated to "8" (4+2×9−14=8) by such processing.

Here, the extracting section 28 may extract the test data after shifting a bit of the connected memory data by the amount of shift corresponding to the byte location stored in the location register 25. For example, the extracting section 28 may shift the connected memory data such that the head byte of the data to be extracted is the head byte of the connected memory data. Since the location register 25 stores the byte location "8", the extracting section 28 may shift the connected memory data to the left by 8 bytes so that the head byte of the test data C may be the head byte of the memory data in the present embodiment.

Here, the memory data received by the extracting section 28 is shifted, but the memory data stored in each of the registers 26 is not shifted. Moreover, the memory data is shifted such that the location of the head byte of the test data is the head byte of the connected memory data in the present embodiment. However, the memory data may be aligned such that the location of the head byte of the test data is a predetermined any byte location in the memory data in another embodiment.

By repeating such processing, each test data can be extracted. In addition, each test data can be stored on each entry of the cache memory provided in the pattern generating section 70.

Here, there may be a case that the number of entries to be transferred to the cache memory (e.g. the total number of test data to be extracted when one test data is stored on one entry) is not an integral multiple of the number of test data extracted in parallel. For example, when the number of entries to be transferred is 5, and the number of parallels is 4, the data is transferred to the cache memory twice. At this time, 8 entries are transferred (4 parallels are transferred twice) to the cache memory, and unnecessary data is stored on the last 3 entries. Even if such case, the cache memory is controlled not by the FIFO but by bank by bank for example, so that the test pattern can be generated without using the unnecessary data. However, it is preferred that the amount of data transferred to each bank is controlled not to be more than the capacity of the bank.

Moreover, each memory may be controlled in asynchronism with the test cycle. In addition, the period of the clock for write is different from that of the clock for read in each memory.

Figure 8:
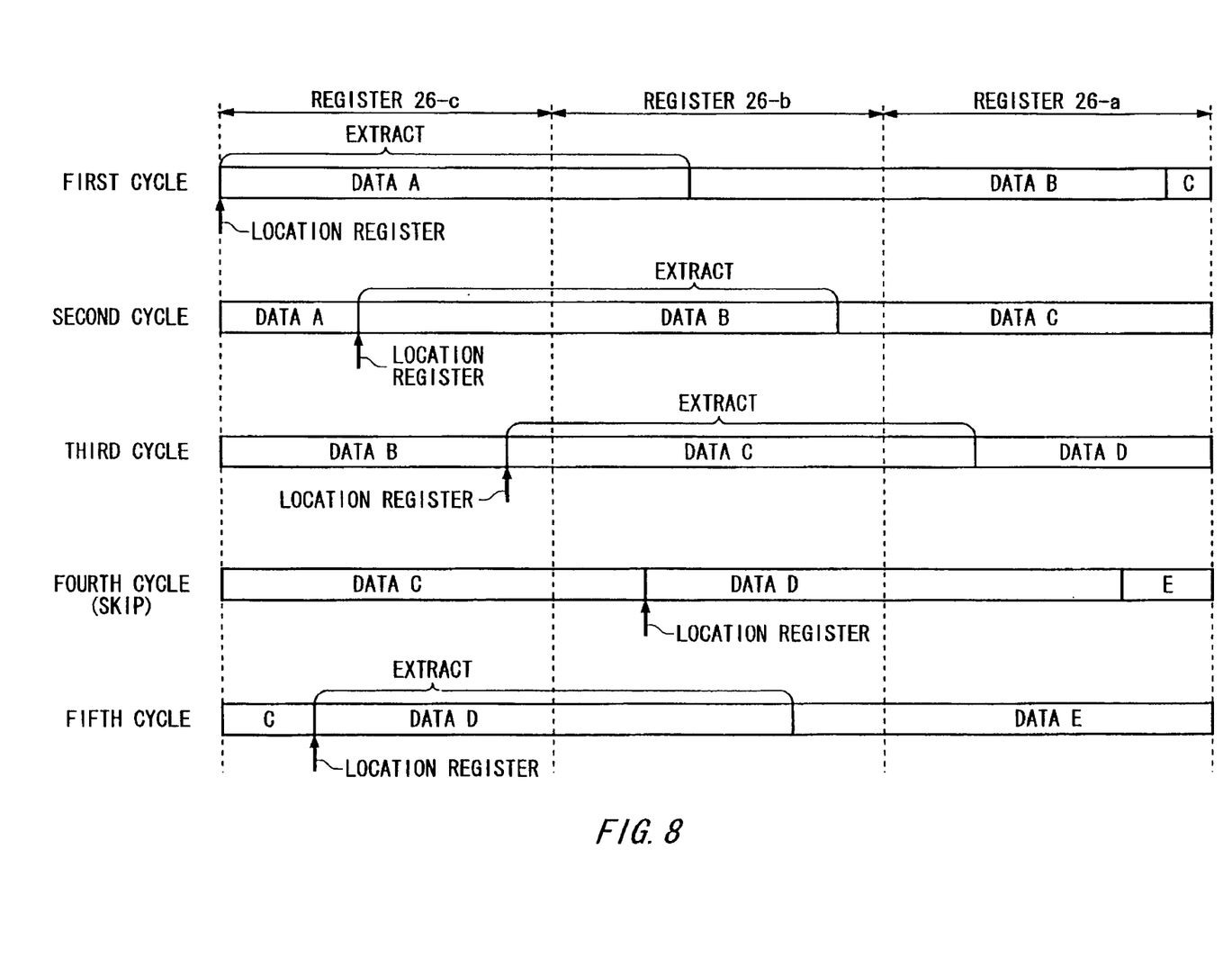
FIG. 8 shows another example of memory data stored in each register 26 for each cycle.

FIG. 8 shows another example of memory data stored in each register 26 in each cycle. Here, a case that the pattern length of the test data is longer than the word length of the main memory 40 (i.e. the byte length of the memory data stored in one register 26) will be described in the present embodiment. Here, the pattern length is not an integral multiple of the word length.

For ease of explanation, the word length is "14" and the pattern length is "20" as operative examples. In addition, the location register 25 stores the byte location "0" as the initial value of the location information for the first cycle. Here, the operations of the extracting section 28 and the location register updating section 27 are the same as that described with reference to FIG. 7.

For the first cycle, the byte location "0" is subtracted from the word length "14" and divided by the pattern length "20", so that the quotient is "0" and the remainder is "14". Therefore, the extracting section 28 judges that the number of test data of which head byte is stored in the last register 26-c is 1. Then, the extracting section 28 extracts one test data A. The byte location stored in the location register 25 is updated to "6" (0+1×20−14=6) by such processing.

In the same way, one test data B is extracted and the byte location stored in the location register 25 is updated to "12" for the second cycle. Also one test data C is extracted and the byte location stored in the location register 25 is updated to "18".

The result by which the byte location "18" is subtracted from the word length "14" is a negative value for the fourth cycle. In this case, the extracting section 28 determines that the head byte of the test data to be extracted is not stored in the last register 26-c for the cycle and skips over the extraction of the test data for the cycle. The skipping over the extraction of the test data also may be performed in the embodiment with reference to FIG. 7 in the same way. It may be determined whether the extraction of the test data is skipped based on the code as the result of subtracting the byte location from the product of the word length and the number of parallels "9×2" in FIG. 7.

The extracting section 28 notifies the location updating section 27 of that the extraction of the test data for the cycle is terminated and that the number of test data extracted is 0. The location register updating section 27 updates the byte location stored in the location register 25 to "4" (18+0×20−14=4). Each test data can be extracted by the above described processing.

Figure 9:
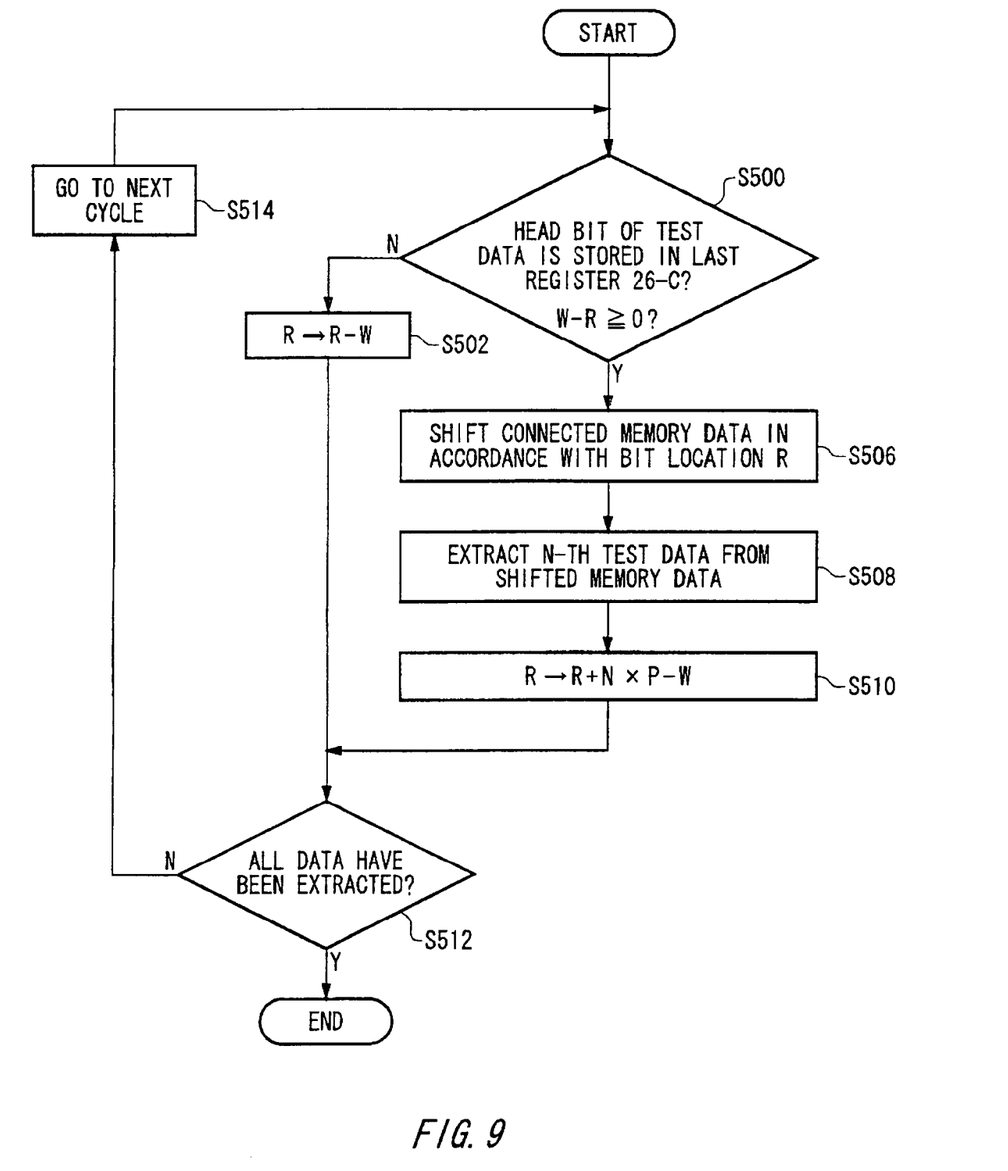
FIG. 9 is a flowchart showing an example of the test data extraction described with reference to FIG. 7 and FIG. 8.

FIG. 9 is a flowchart showing an example of the test data extraction described with reference to FIG. 7 and FIG. 8. Firstly, the extracting section 28 judges whether the head byte of any test data is stored in the last register 26-c (S500). As described above, the extracting section 28 may judge whether the value obtained by subtracting the byte location R stored in the location register 25 from the word length W of the main memory 40 is more than 0.

When the subtraction value is a negative value, the extracting section 28 skips over the extraction of the test data for the cycle and notifies the location register updating section 27 of that effect. The location register updating section 27 stores in the location register 25 the value obtained by subtracting the word length W from the byte location R stored in the location register 25 as a new byte location R (S502).

The extracting section 28 judges whether the total number of test data to be extracted is extracted (S512). For example, the extracting section 28 may whether the number of test data corresponding to the free area of the pattern cache memory 90 or the sequence cache memory is extracted. For example, the extracting section 28 may judge whether the number of test data to be extracted is extracted based on whether the number of cycles corresponding to the free area of the cache memory lapses after starting to extract the test data.

When the number of test data to be extracted has been extract the extracting section 28 terminates the extraction of the test data. Meanwhile, when the number of test data to be extracted has not been extracted, the extracting section 28 starts a processing for the next cycle (S514). At this time, the extracting section 28 performs the processing from S500 again.

Next, the extracting section 28 shifts the connected memory data based on the byte location R stored in the location register 25 (S506). Then, the extracting section extracts N-th test data from the shifted memory data (S508). Here, N may be the number of parallels described above with reference to FIG. 7. In addition, when the pattern length is longer than the word length, N may be 1.

At this time, the extracting section 28 notifies the location register updating section 27 of that the test data is extracted. The location register updating section 27 stores the value obtained by adding the product of the extracted N-th test data and the pattern length P to the byte location R stored in the location register 25 and subtracting the word length W therefrom in the location register 25 as a new byte location R (S510). Then, the extracting section 28 judges whether the number of test data to be extracted has been extracted.

Therefore, each test data is extracted and stored in the cache memory by such processing. Here, for the test module 100, the word length of the main memory 40 and the pattern length of the test data may be set such that the word length for each data transfer is not an integral multiple of the pattern length for each test data and the pattern length is not an integral multiple of the word length.

Here, even if one test data is stored across the different words stored in the main memory 40, the test data is extracted and stored in the cache memory by the above described processing. In addition, it has been described about the processing with reference to FIG. 7-FIG. 9. on the basis of the byte of data, however, the processing may be performed on the basis of the bit of data. For example, the processing as described above may be performed by using the head bit of the test data instead of the head byte of the test data described above.

Figure 10:
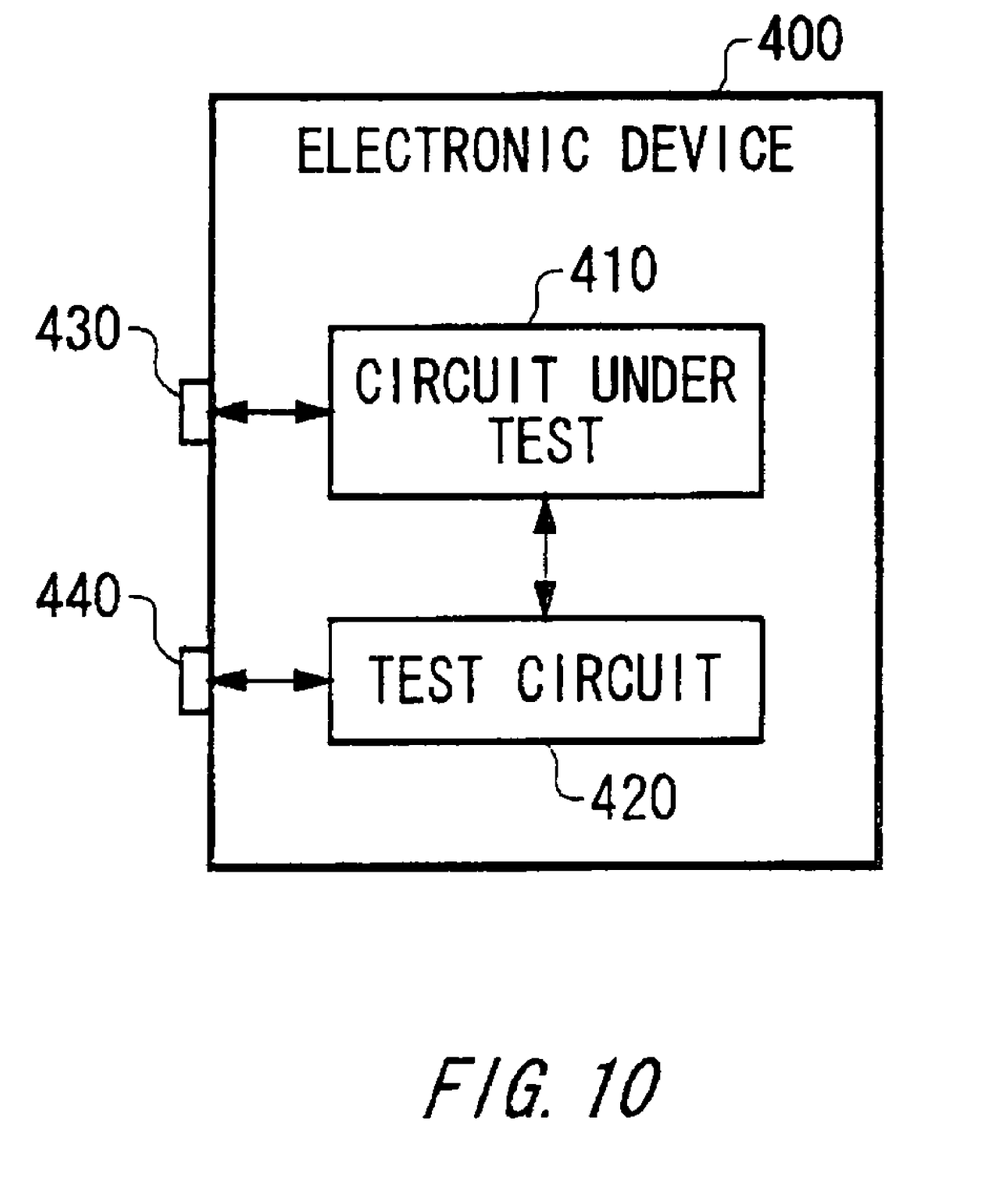
FIG. 10 shows an example of electronic device 400 according to the present invention.

FIG. 10 shows an example of an electronic device 400 according to an embodiment of the present invention. The electronic device 400 includes a circuit under test 410, a test circuit 420, an input/output pin 430 and a BIST pin 440. The circuit under test 410 may be a circuit that operates when the electronic device 400 actually operates. The circuit under test 410 operates in accordance to a signal provided from the input/output pin 430 when the electronic device actually operates.

For example, in a case that the electronic device 400 is a memory device, the circuit under test 410 may be a circuit including a memory cell of the electronic device 400. For example, the circuit under test 410 may be a memory cell and a control circuit that controls the memory cell. The control circuit may be a circuit that controls to write data to the memory cell and read data from the memory cell.

The test circuit 420 is provided on a semiconductor chip on which the circuit under test 410 is also provided and tests the circuit under test 410. The test circuit 420 may have the configuration the same as that of the test module 100 described with reference to FIG. 1-FIG. 9. In addition, the test circuit 420 may have a part of configuration of the test module 100. Moreover, the test circuit 420 may be a circuit that performs a part of function of the test module 100. For example, the test circuit 420 does not necessarily need the result memory 16. Then, the rate generating section 30 and the timing generating section 56 of the test circuit 420 may operate by a setting value of the fixed timing set.

Moreover, the test circuit 420 may test the circuit under test 410 when a signal indicating that a self-test of the circuit under test 410 is performed is provided from an external test apparatus through the BIST pin 440. It is preferred that the BIST pin 440 is not used when the electronic device 40 actually operates. Then, the test circuit 420 may output the test result of the circuit under test 410 from the BIST pin 440 to the external test apparatus.

The external test apparatus may operate as well as the site control device 130 described above with reference to FIG. 1. That is, the test control program, the test program data and the test pattern data and so forth may be provided to the test circuit 420 in order to operate the test circuit 420 as well as the test module 100 described above with reference to FIG. 1-FIG. 9.

While the invention has been described by way of the exemplary embodiments, it should be understood that those skilled in the art might make many changes and substitutions without departing from the spirit and scope of the invention. It is obvious from the definition of the appended claims that the embodiments with such modifications also belong to the scope of the invention.

As evidenced by the above description, according to the present embodiments, each test data can be stored on the entry of the cache memory in units of test data even if the test data are stored across a plurality of words of the main memory 40. Therefore, even if the test data is stored in the main memory 40 in the above described manner, the pattern generating section 70 can easily generate a test pattern.

Therefore, the availability ratio of the storage area of the main memory 40 can be improved. Moreover, the throughput of the data transfer for the main memory 40 also can be improved.

What is claimed is:

1. A test apparatus that test a device under test, comprising:
   a main memory that stores a test data row for testing the device under test;
   a cache memory that caches the test data row read from the main memory;
   a pattern generation control section that reads each test data which is not aligned in units of word being a data transfer unit and writes the same to each cache entry different from each other in the cache memory for each test data; and
   a pattern generating section that sequentially processes the test data stored on each cache entry in the cache memory and generates a test pattern for testing the device under test,
   wherein the main memory stores at least one of the test data to be stored on each cache entry of the cache memory across at least continuous two words of the main memory,
   wherein the pattern generation control section includes:
   a register pipeline having a plurality of registers which are cascade-connected, wherein a first register sequentially stores the memory data for each word which are sequentially read from continuous words of the main memory for each cycle and each subsequent register receives the memory data stored in the preceding register for each cycle and sequentially stores therein the same; and
   an extracting section that generates the memory data for a plurality of words obtained by connecting the data stored in the plurality of registers included in the register pipeline, and extracts each test data from the connected memory data,
   wherein the extracting section shifts the connected memory data by the amount of shift corresponding to the location of the test data in the last register when at least a part of test data to be extracted is stored in the last register and aligns the location of the test data in the connected memory data after shifting with a predetermined location, and skips to extract an instruction from memory data for the plurality of words for a cycle for which at least a part of test data to be extracted is not stored in the last register, wherein the pattern generation control section includes:

a location register that stores the location of the test data to be extracted in the last register; and a location register updating section that adds the pattern length of the extracted test data to the location register in response to extracting the test data from the memory data for the plurality of words and subtracts the word length of the main memory from the location register for each cycle, and wherein the extracting section shifts the memory data for the plurality of words to a direction to decrease the location of the instruction by the amount of shift corresponding to the value of the location register when at least a part of test data to be extracted is stored in the last register.

2. The test apparatus as set forth in claim 1, wherein the main memory stores therein each test data included in the test data such that each test data is stored adjacent to each other without any free space on a storage area.

3. The test apparatus as set forth in claim 2, wherein the pattern generation control section connects the test data stored across two or more continuous words of the main memory and extracts the same.

4. The test apparatus as set forth in claim 3, wherein the pattern generation control section connects the test data stored across the two or more continuous words of the main memory by connecting the memory data for each word which is sequentially read from continuous words of the main memory for each cycle and extracts each test data from the connected memory data.

5. The test apparatus as set forth in claim 2, wherein the word length of the main memory and the pattern length of the test data can be set to an value such that the word length for each data transfer is not an integral multiple of the pattern length for each test data and the pattern length is not an integral multiple of the word length.

6. The test apparatus as set forth in claim 1, wherein the extracting section extracts a first test data and a second test data when the first test data to be extracted and at least a part of the second test data following the first test data are stored in the last register, and writes the extracted first test data and second test data to the cache memory in parallel.

7. The test apparatus as set forth in claim 1, wherein the main memory stores as the test data rows sequence data that defines a test sequence for testing the device under test and a pattern data expanded by executing the sequence data, the cache memory including:

a sequence cache memory that caches the sequence data; and a pattern cache memory that caches the pattern data, the pattern generating section sequentially executes the instruction stored on each cache entry of the sequence cache memory, sequentially designate addresses in the pattern cache memory, and causes the pattern cache memory to output the pattern data of the addresses sequentially designated, thereby sequentially reading the test data corresponding to the executed instruction which is stored in each cache entry and outputting the same.

8. The test apparatus as set forth in claim 7, wherein the pattern length of each instruction included in the sequence data is different from that of each pattern included in the pattern data.

9. An electronic device comprising:

a circuit under test that operates in accordance with a signal inputted to the device when the device actually operates; and a test circuit that tests the circuit under test, wherein the test circuit including:

a main memory that stores a test data row for testing the circuit under test;

a cache memory that caches the test data row read from the main memory;

a pattern generation control section that reads each test data which is not aligned in units of word being a data transfer unit and writes the same to each cache entry different from each other in the cache memory for each test data, and a pattern generating section that sequentially processes the test data stored on each cache entry in the cache memory and generates a test pattern for testing the circuit under test, wherein the main memory stores at least one of the test data to be stored on each cache entry of the cache memory across at least continuous two words of the main memory, wherein the pattern generation control section includes:

a register pipeline having a plurality of registers which are cascade-connected, wherein a first register sequentially stores the memory data for each word which are sequentially read from continuous words of the main memory for each cycle and each subsequent register receives the memory data stored in the preceding register for each cycle and sequentially stores therein the same; and an extracting section that generates the memory data for a plurality of words obtained by connecting the data stored in the plurality of registers included in the register pipeline, and extracts each test data from the connected memory data, wherein the extracting section shifts the connected memory data by the amount of shift corresponding to the location of the test data in the last register when at least a part of test data to be extracted is stored in the last register and aligns the location of the test data in the connected memory data after shifting with a predetermined location, and skips to extract an instruction from memory data for the plurality of words for a cycle for which at least a part of test data to be extracted is not stored in the last register, and wherein the pattern generation control section includes:

a location register that stores the location of the test data to be extracted in the last register; and a location register updating section that adds the pattern length of the extracted test data to the location register in response to extracting the test data from the memory data for the plurality of words and subtracts the word length of the main memory from the location register for each cycle, and wherein the extracting section shifts the memory data for the plurality of words to a direction to decrease the location of the instruction by the amount of shift corresponding to the value of the location register when at least a part of test data to be extracted is stored in the last register.

* * * * *